(12) United States Patent
Wang (10) Patent No.: US 6,255,140 B1
(45) Date of Patent: Jul. 3, 2001

(54) FLIP CHIP CHIP-SCALE PACKAGE

(75) Inventor: Hsing-Seng Wang, Tau-Yuan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/413,047

(22) Filed: Oct. 6, 1999

Related U.S. Application Data (62) Division of application No. 09/175,216, filed on Oct. 19, 1998.

(51) Int. Cl.$^7$ .................................................. H01L 21/44
(52) U.S. Cl. ......................... 438/122; 438/108; 438/118
(58) Field of Search ..................................... 438/108, 118, 438/119, 122, 124, 125, 126, 127; 257/704, 712, 713, 778

(56) References Cited

U.S. PATENT DOCUMENTS

| | | | |
|---|---|---|---|
| 5,510,956 | * 4/1996 | Suzuki ................................. | 257/713 |
| 5,672,548 | * 9/1997 | Culnane et al. ...................... | 438/118 |
| 5,789,810 | * 8/1998 | Gross et al. .......................... | 257/704 |
| 5,805,422 | * 9/1998 | Otake et al. .......................... | 257/778 |
| 5,866,943 | * 2/1999 | Mertol .................................. | 257/712 |
| 5,898,224 | * 4/1999 | Akram .................................. | 257/778 |
| 5,905,636 | * 5/1999 | Baska et al. ......................... | 257/713 |
| 5,909,056 | * 6/1999 | Mertol .................................. | 438/122 |
| 5,909,057 | * 6/1999 | McCormick et al. ................ | 257/712 |
| 6,008,536 | * 12/1999 | Mertol .................................. | 257/712 |
| 6,069,023 | * 5/2000 | Bernier et al. ....................... | 438/118 |

* cited by examiner

Primary Examiner—Kevin M. Picardat (57) ABSTRACT

A semiconductor flip chip chip-scale package that includes a metal heat slug bonded to the surface of a semiconductor chip. The heat slug protects the chip from being damaged as well as assists heat dissipation. Openings may also be formed on the heat slug to provide better air flow for cooling. A first packaging process for the chip-scale packages bonds a single heat slug to each semiconductor chip on a substrate panel. A second packaging process bonds a long heat slug comprising a plurality of connected heat slugs to the semiconductor substrate panel at the same time. Conventional packaging equipment can be used for both packaging processes to manufacture the chip-scale packages.

10 Claims, 10 Drawing Sheets

FLIP CHIP CHIP-SCALE PACKAGE

This is a division of Ser. No. 09/175,216, filed Oct. 19, 1998.

FIELD OF THE INVENTION

The present invention relates generally to semiconductor chip packages, and more particularly to a flip chip chip-scale package.

BACKGROUND OF THE INVENTION

Packaging semiconductors is a vital aspect of semiconductor manufacturing. There are many types of packaging configurations available, such as ball grid arrays (BGA), flip chip and more recently, chip-scale packages. Basically, chip-scale packages can be categorized as flex substrate, rigid substrate, lead frame and wafer-level assembly. In the categories of flex substrate and rigid substrate, both flip chip and wire bonding technologies may be used.

Flip chip packages are quite fragile and require careful assembly and handling techniques. Chip-scale packages are being developed to combine the high density of the BGA packages and the small size of the flip chip packages. The chip-scale package need only be slightly larger than the bare chip.

Figure 1:
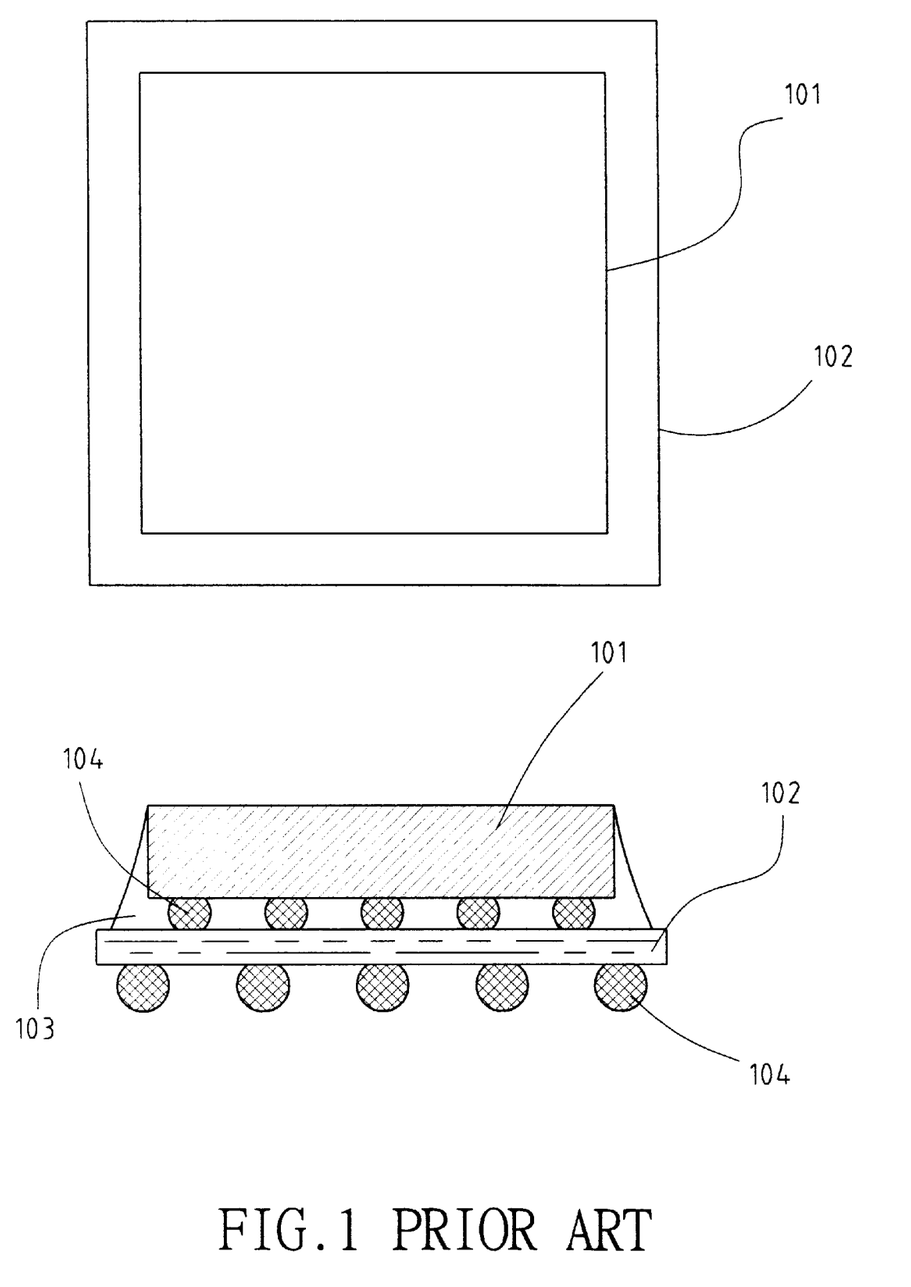
FIG. 1 illustrates a conventional flip chip chip-scale package.

An example of a packaging technique for a conventional flip chip chip-scale package (CSP) is shown in FIG. 1. In the flip chip CSP, a semiconductor die 101 is first mounted to the top surface of a substrate 102 using flip chip technique. An under fill region 103 is then formed below the die and at an outer circumferential surface of the solder balls 104 formed on the surface of the die 101. In the chip-scale package, solder balls 104 are attached to I,O pads on the surface of the substrate 102.

The packaging technique shown in FIG. 1 has some disadvantages. One is that chips are subject to damage because they are exposed during packaging steps. Another problem is that an external heat sink can not be easily attached to the die for high-power chip packages.

Figure 2:
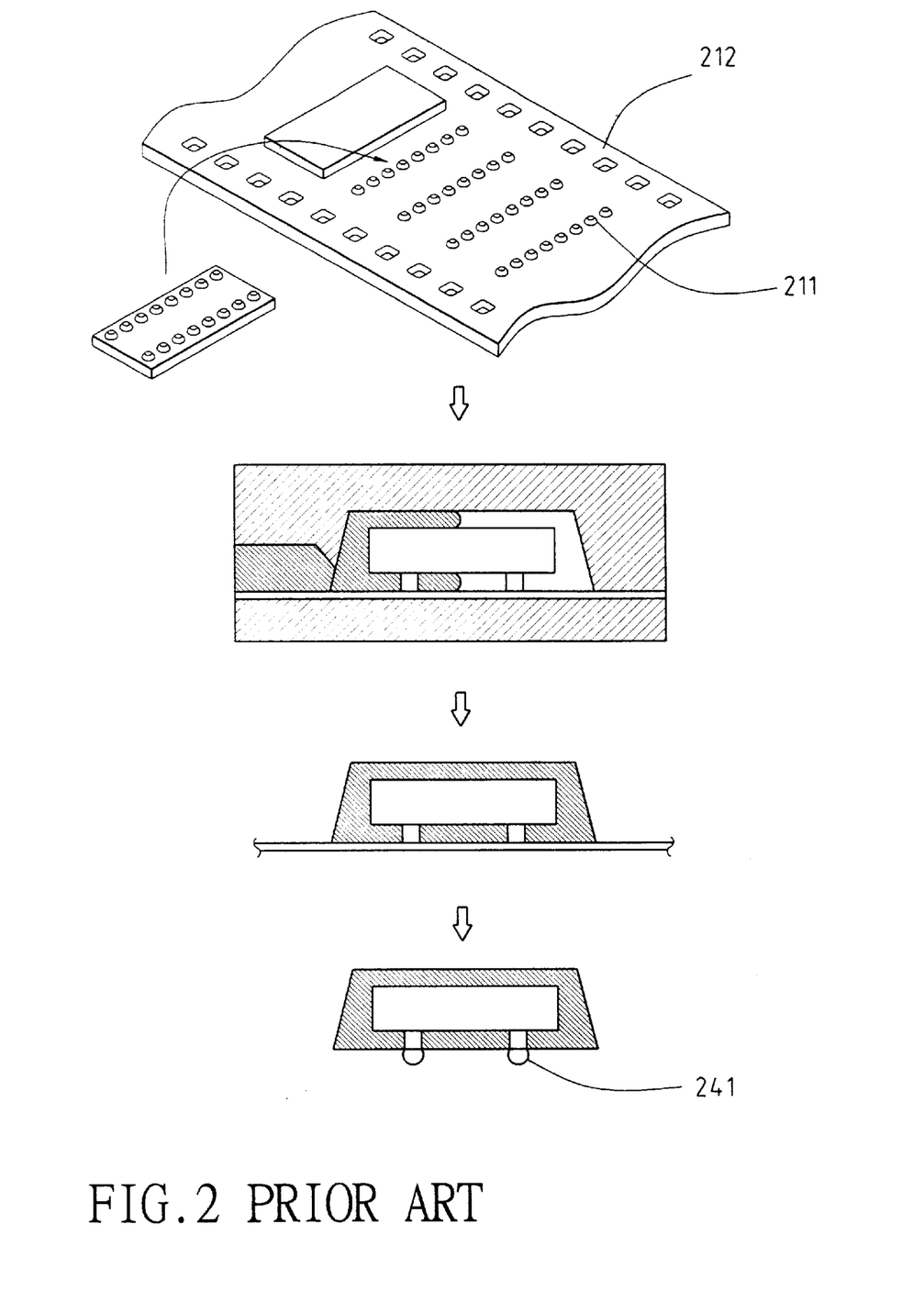
FIG. 2 illustrates the final assembly process of a Mitsubishi chip-scale package.

Another example of a conventional packaging technique is shown in FIG. 2, which illustrates the final assembly process of a Mitsubishi CSP. In the final assembly process, four general steps are taken. They are steps of inner bump bonding, encapsulation, base frame separation, and solder ball attachment. At the step of inner bump bonding, the inner bumps 211 are first formed on a base frame 212. The chip is then over-molded with an encapsulating material for protection. External electrode bumps 241 are formed and directly bonded to the bond pads after the inner bumps are separated from the base frame 212. The electrode bumps serve as the external electrodes for surface mounting on a printed circuit board.

The CSP final assembly process shown in FIG. 2 also has some disadvantages. One is forming the inner bumps is a complicate process. Another problem is chips are not easy to be cooled off due to the externally molded plastic protection.

SUMMARY OF THE INVENTION

This invention has been made to overcome the above mentioned drawbacks for flip chip chip-scale packages. It is an object of the present invention to provide a flip chip chip-scale package with a metal heat slug overlaying the surface of a semiconductor chip. By having an externally attached heat slug, the hardness and the strength of the chip package is improved. The chip-scale package of the invention protects chips from being cracked. It also makes the heat of the chip dissipating faster so that the chip may cool faster. This invention also enhances electrical shielding for the chips. In the mean time, it reduces electromagnetic interference for the chips.

Another object of the invention is to provide a packaging process in which current standard integrated circuit packaging equipment may be used. Using the standard packaging equipment eliminates the high cost associated with purchasing specialized manufacturing equipment. The packaging technique of the invention is simple enough that automatic manufacturing of chip-scale packages is also achievable. In the mean time, the packaging process allows an external heat sink to be attached easily.

In a first embodiment of the flip chip chip-scale package of this invention, a heat slug overlays on the upper surface of a CSP. Adhesive epoxy is directly applied between the inner surface of the heat slug and the top surface of the die for bonding the heat slug and the die together. In this manner, the heat slug serves as a protection device as well as a heat dissipation sink.

In a second embodiment of the flip chip chip-scale package of this invention, a portion of the heat slug is removed. The adhesive epoxy that bonds the heat slug to the die is only applied to the edge of the upper surface of the die. In this embodiment, because the semiconductor chip is not fully covered by the heat slug, heat may be better dissipated.

The foregoing and other objects, features, aspects and advantages of the present invention will become more apparent from a careful reading of a detailed description provided herein below, with appropriate reference to the accompanying drawings.

DETAILED DESCRIPTION OF THE PREFERRED EMBODIMENTS

Figure 3A:
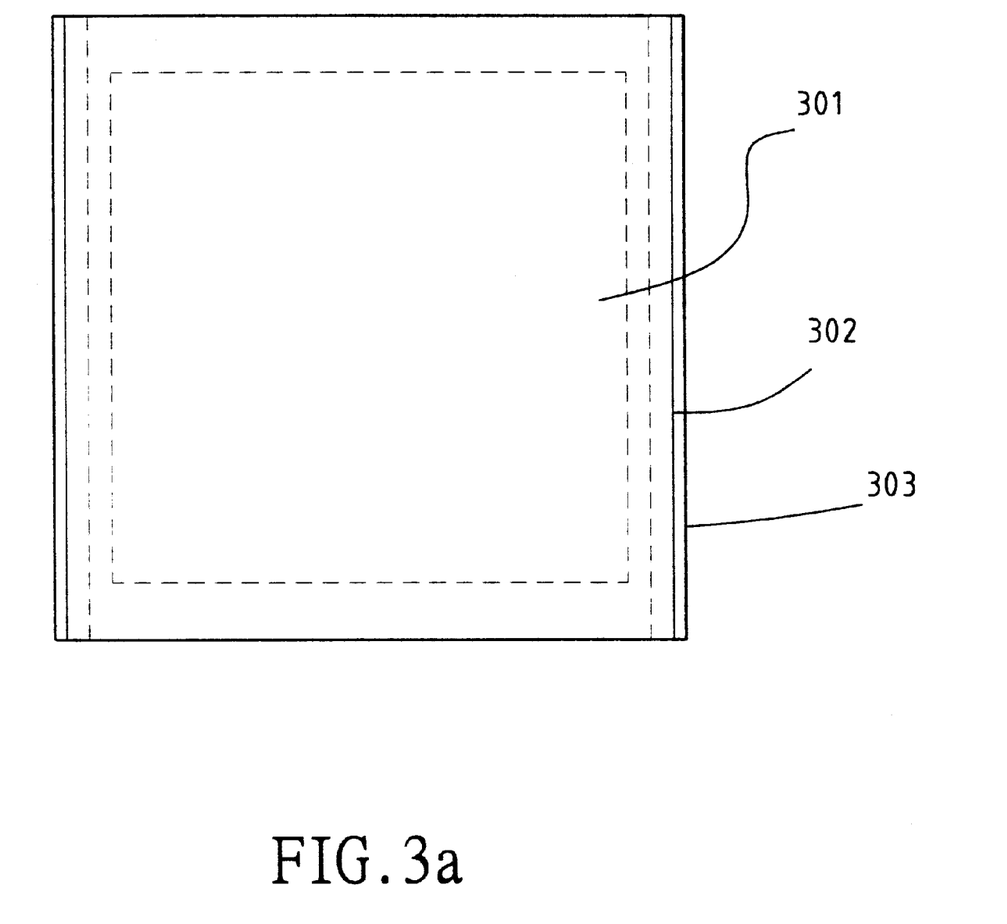
FIGS. 3a–3b illustrate a first embodiment of the flip chip chip-scale package in accordance with the present invention.
Figure 3B:
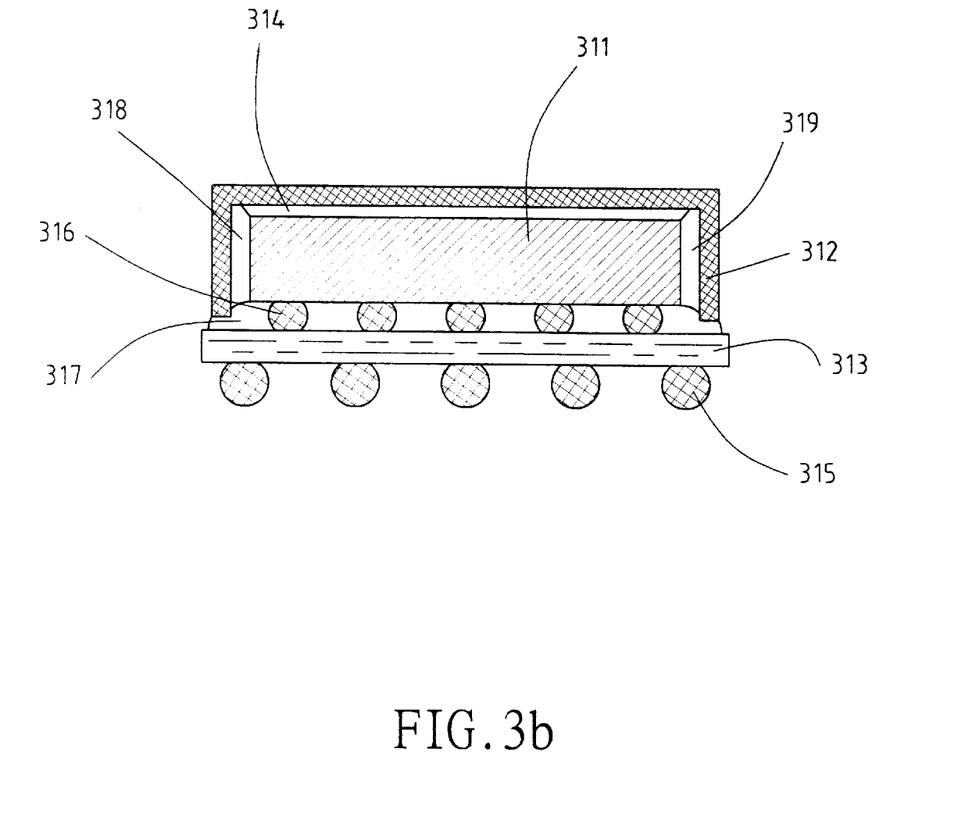

FIGS. 3a–3b illustrate a flip chip chip-scale package in accordance with a first embodiment of the present invention. Referring to FIG. 3a that shows the top view of the chip-scale package, a die 301 is mounted to the upper surface of a substrate 303. A heat slug 302 slightly larger than the die overlays the top surface of the die 301.

FIG. 3b shows a cross-sectional view of the first embodiment of the present invention. The flip chip chip-scale package of FIG. 3b comprises a die 311, a substrate 313 having top and bottom surfaces, and a heat slug 312 overlaying the upper surface of the die 311. The die 311, the substrate 313 and the heat slug 312 of FIG. 3b correspond to the die 301, the substrate 303 and the heat slug 302 of FIG. 3a.

As can be seen from FIGS. 3a and 3b, the heat slug 312 looks like a cap having a reversed U-shape cross section. The heat slug 312 may also be connected to the ground of the substrate circuit for providing electrical shield for the circuit. A layer of thermally conductive adhesive material such as adhesive epoxy 314 is applied to the upper surface of the die 311 for bonding the heat slug 312 and the die 311. In general, epoxies having good heat conductivity are appropriate adhesive material for the bonding.

The die 311 and the heat slug 312 are mounted to the external substrate 313 using an array of solder balls (or similar electrode bumps) 315. Solder balls 315 or 316 are attached directly to the bond pads or I/O pads formed on the lower surface of the die 311. Between the semiconductor die 311 and the substrate 313, an under-fill layer 317 is formed on the upper surface of the substrate 313 and at an outer circumferential surface of the solder balls 316.

The major functions of the heat slug overlaying the surface of the die are to protect chips from being cracked and to help the dissipation of heat generated by the chip. If the heat slug is connected to the ground of the substrate circuit, it also has shielding effect that makes the circuit less sensitive to noise interference.

As mentioned earlier, the heat slug is bonded to the die by means of the adhesive epoxy 314 applied on the upper surface of the die. The space 318 or 319 as shown may exist between the two vertical sides and the heat slug 312. It is not necessary to fill the space with epoxy. The heat slug 312 made of metal not only protects the die from being damaged but also helps the dissipation of heat generated by the chip package.

Figure 4A:
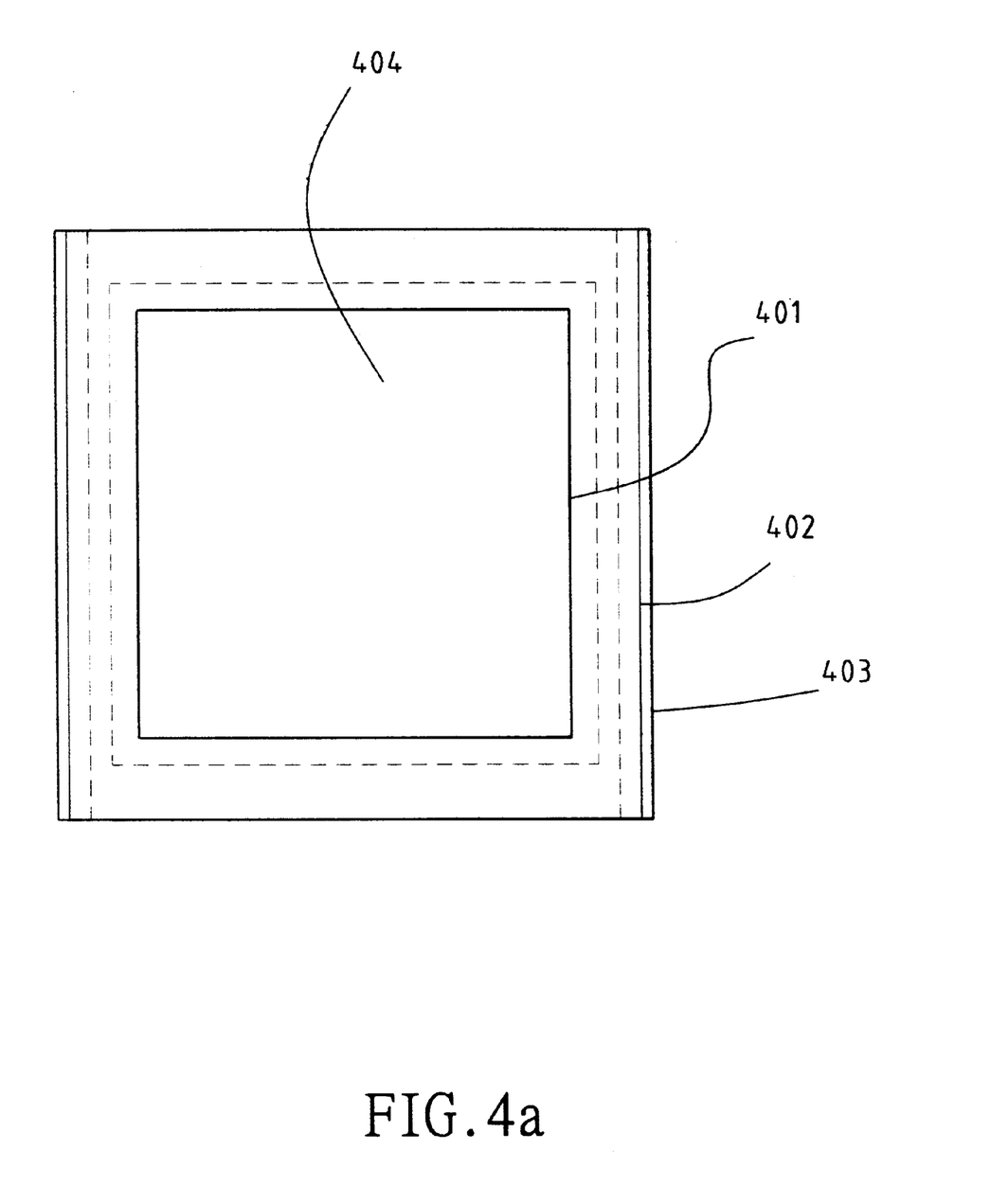
FIGS. 4a–4b illustrate an alternative embodiment of the flip chip chip-scale package in accordance with the present invention.
Figure 4B:
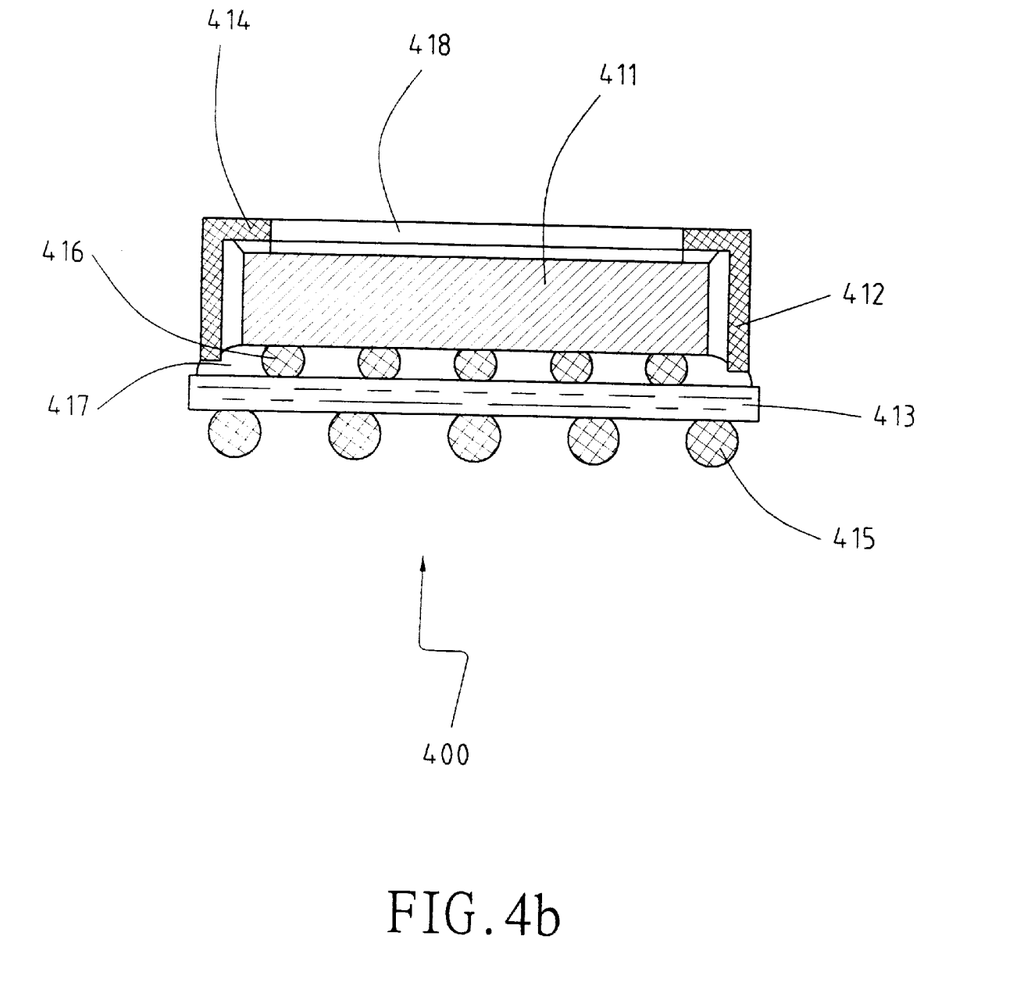

FIGS. 4a–4b illustrate a second embodiment of the invention. In this embodiment, a portion of the heat slug overlaying the surface of the die is removed. As shown in FIG. 4a, a die 401 is mounted to the upper surface of a substrate 403. The die 401 is covered with the metal heat slug 402 on which an opening 404 is formed to expose the die 401.

FIG. 4b shows a cross-sectional view of the second embodiment of the present invention. This embodiment uses the same components as the first embodiment. The flip chip chip-scale package of FIG. 4b comprises a die 411, a substrate 413, and a metal heat slug 412 overlaying the die 411. The die 411 is exposed through an opening 418. The die 411, the substrate 413 and the heat slug 412 of FIG. 4b correspond to the die 401, the substrate 403 and the heat slug 402 of FIG. 4a.

Appropriate adhesive material such as adhesive epoxy 414 is applied to the upper edges of the die 411. The flip chip chip-scale package 400 is mounted to the substrate 413 using an array of solder balls (or similar electrode bumps) 415. Solder balls 415 or 416 are attached directly to the bond pads or I/O pads formed on the surface of the die 411. An under-fill layer 417 is formed on the top surface of the substrate 413 and at an outer circumferential surface of the solder balls 416. The detail of the connection or the function of each component of this embodiment is similar to that described in FIG. 3b.

Due to the removal of a portion of the metal heat slug, the surface on the chip in the second embodiment may have direct airflow. The die thus may be easier to be cooled off. However, the first embodiment has a stronger package because the die is fully covered and protected by the heat slug.

Figure 5A:
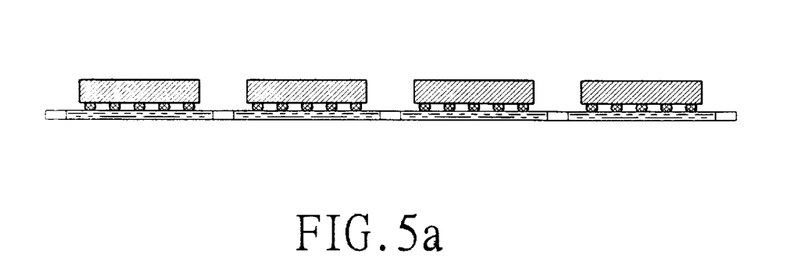
FIG. 5a–5f illustrate the steps of a packaging process of the present invention for the first embodiment shown in FIGS. 3a–3b.
Figure 5B:
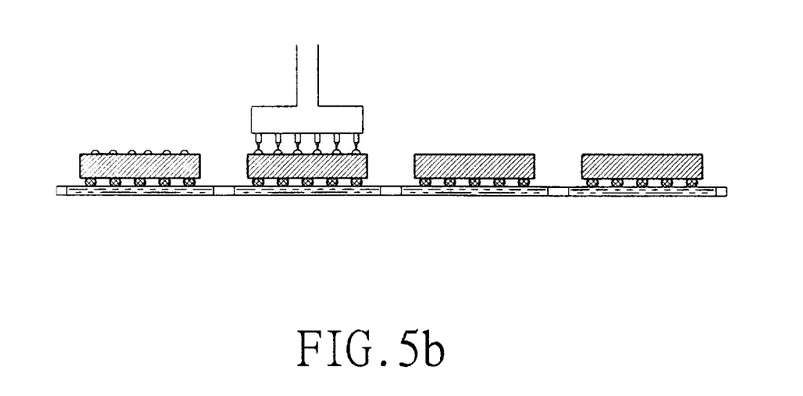

FIGS. 5a through 5f illustrate the steps of packaging the flip chip chip-scale package of the first embodiment as shown in FIGS. 3a and 3b. As shown in FIG. 5a, an array of dies is first attached to a substrate using solder balls. In the step of FIG. 5b, a thin layer of adhesive material such as adhesive epoxy is applied on the top surface of each die. As mentioned before, the adhesive material should be thermally conductive.

Figure 5C:
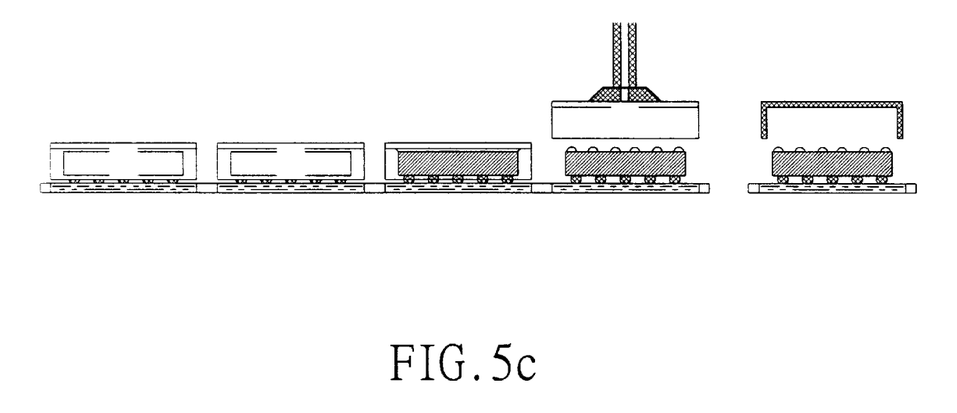
Figure 5D:
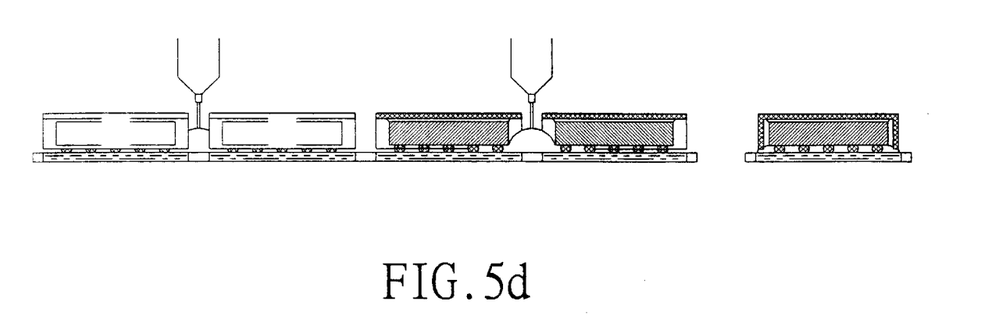

A heat slug is then positioned to overlay each die and then bonded to the die as shown in FIGS. 5c and 5d. Encapsulating material is dispensed on the surface of the substrate through the space between two heat slugs to fill the space among the solder balls underneath the die as illustrated in FIG. 5d. An under fill layer is thus formed to provide more reliable bonding between the die and the substrate.

Figure 5E:
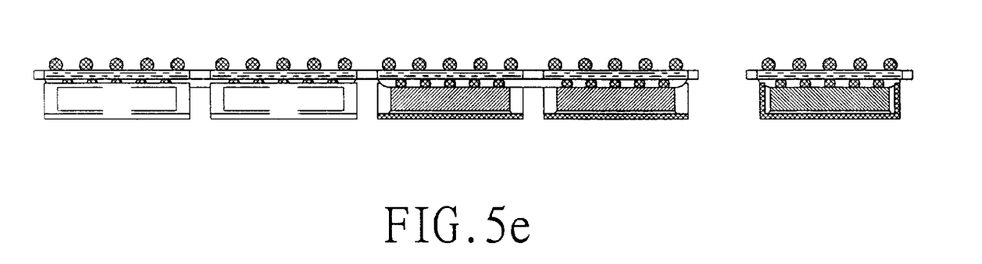
Figure 5F:
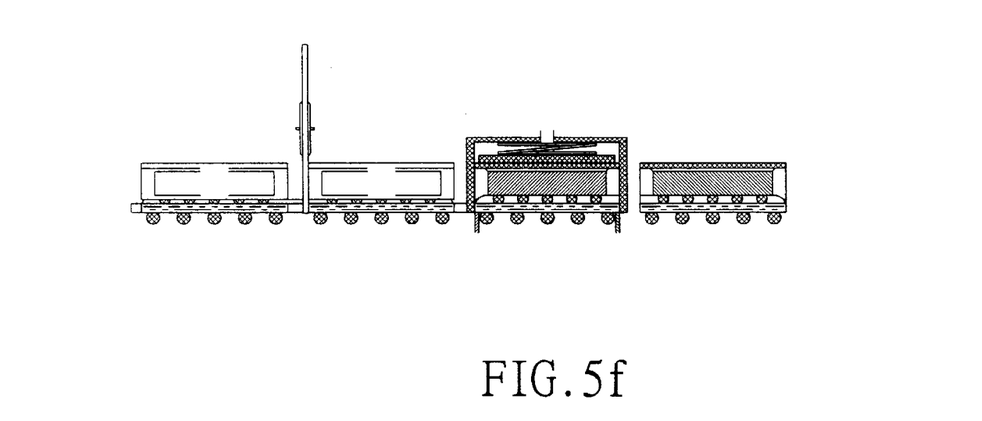

The chip-scale package is then turned up side down and a plurality of solder balls are formed for each die on the bottom surface of the substrate as shown in FIG. 5e. By using a suitable cutting apparatus or a punching technique as illustrated in FIG. 5f, each chip-scale package of this invention is separated from the large substrate. As can be seen from FIGS. 5a–5f, the steps of packaging illustrated can be accomplished by using conventional standard packaging equipment. Therefore, a significant advantage of this invention is that no special additional equipment is necessary.

Figure 6A:
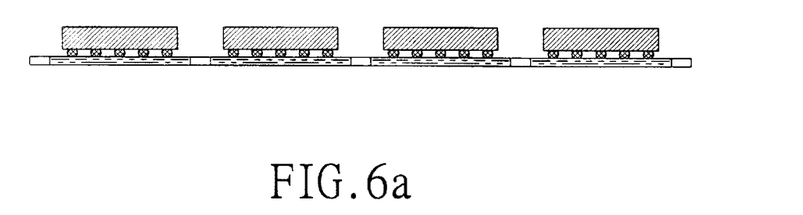
FIG. 6a–6f illustrate the steps of an alternative package process of the present invention for the first embodiment shown in FIGS. 3a–3b.
Figure 6B:
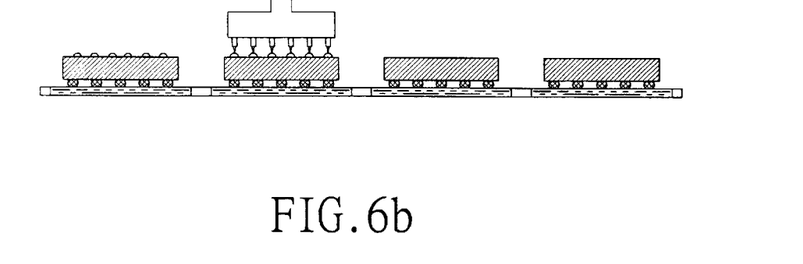

FIGS. 6a through 6f illustrate the steps of an alternative process of packaging the flip chip chip-scale package of the first embodiment as shown in FIGS. 3a and 3b. Similar to FIG. 5a, an array of dies is first attached to a substrate using solder balls as shown in FIG. 6a. In the step of FIG. 6b, a thin layer of adhesive material such as adhesive epoxy is applied on the top surface of each die. As mentioned before, the adhesive material should be thermally conductive.

Figure 6C:
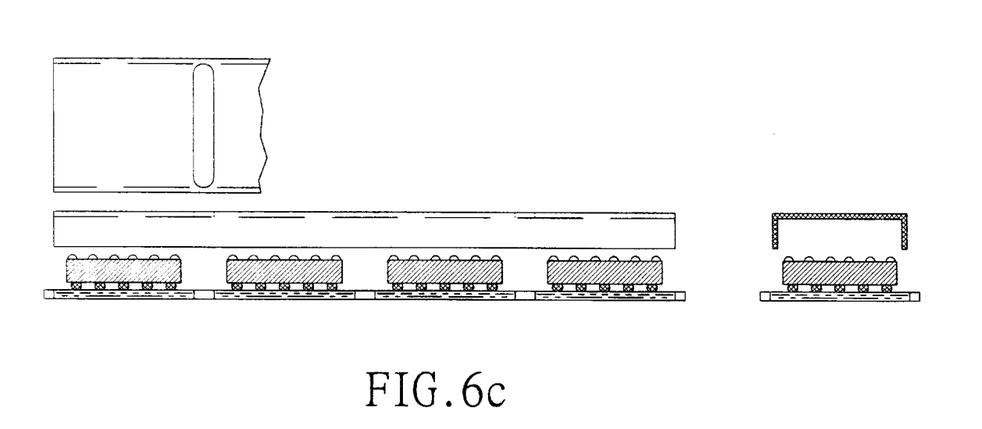

In the packaging process of FIG. 6, plural heat slugs are connected as a long piece of metal as shown in FIG. 6c. Plural slot openings are formed on the upper surface of the metal at regular intervals. The distance between two slot openings is identical to that of the two dies on the substrate. The long heat slug is positioned so that there is a slot opening between every two adjacent dies, and then bonded to the array of dies.

Figure 6D:
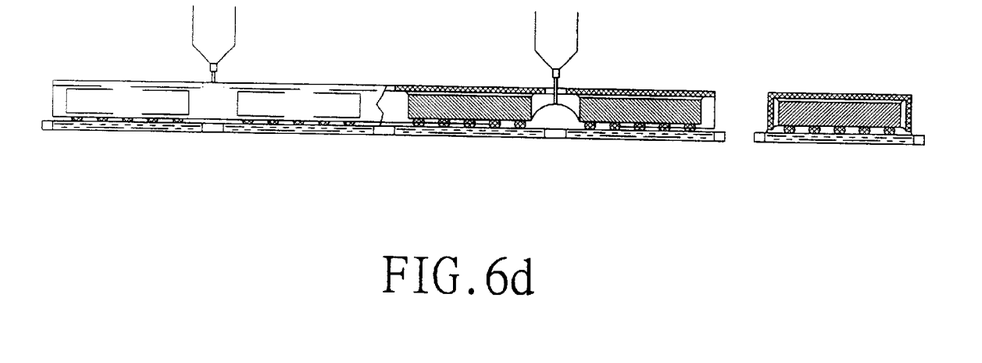
Figure 6E:
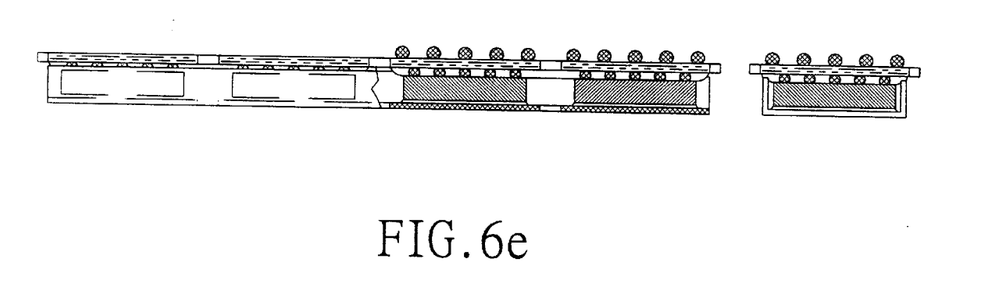

Encapsulating material is dispensed on the surface of the substrate through the opening between every two dies to fill the space among the solder balls underneath the die as illustrated in FIG. 6d. An under fill layer is thus formed to strengthen the bonding between the die and the substrate. It also ensures that the long heat slug is securely bonded to the substrate. The chip-scale package is then turned up side down and a plurality of solder balls are formed for each die on the bottom surface of the substrate as shown in FIG. 6e.

Figure 6F:
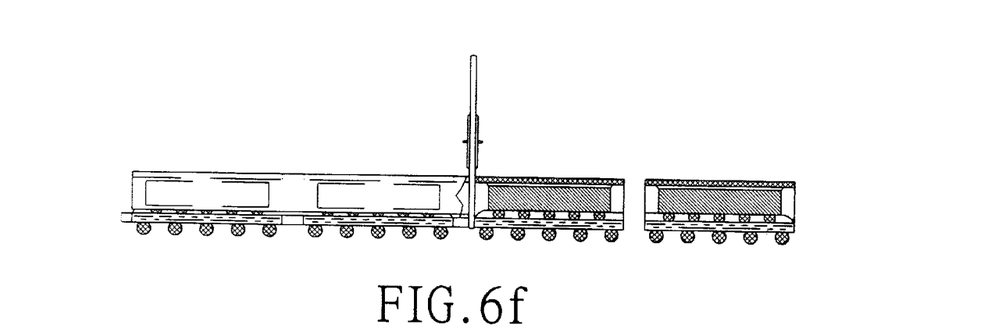

By using a suitable cutting apparatus to cut through the openings between dies as illustrated in FIG. 6f, each flip chip chip-scale package of this invention is separated from the large substrate. Because each flange of the long heat slug is still connected between the two dies as shown in FIG. 6f, a punching technique is not appropriate for separating the chip packages.

The packaging processes as shown in FIGS. 5 and 6 have been described for manufacturing the embodiment of FIG. 3. It can be understood that these processes can also be used for manufacturing the embodiment of FIG. 4. In the process of FIG. 5, it is necessary that an opening be formed on each individual heat slug before it is positioned and bonded to the die in the step shown in FIG. 5c. In addition, in the step of FIG. 5b, adhesive epoxy should only be applied to the edge of the upper surface of the die.

Similarly, in the process of FIG. 6, another set of openings should be formed on the long heat slug in the step of FIG. 6c in addition to the slot openings described earlier. In the step of FIG. 6b, the adhesive epoxy should be applied only to the edge of the upper surface of the die. When the long heat slug is positioned and bonded to the chips, in addition to the slot opening between every two adjacent dies, there should be at least one more opening above each die according to the embodiment of FIG. 4.

Although this invention has been described with a certain degree of particularity, it should be understood that the present disclosure has been made by way of preferred embodiments only. And, that numerous changes in the detailed construction and combination as well as arrangement of parts may be restored to without departing from the spirit or scope of the invention as hereinafter set forth.

What is claimed is:

1. A packaging process for manufacturing semiconductor chip-scale packages, comprising the steps of:

preparing a substrate panel having top and bottom surfaces;

attaching a plurality of semiconductor chips to the top surface of said substrate panel using flip chip technology;

applying an adhesive material on the upper surfaces of said semiconductor chips;

bonding a heat slug to each semiconductor chip, said heat slug having a top plate covering the semiconductor chip and a plurality of flanges extending down by the sides of the semiconductor chip;

forming an under fill layer between said semiconductor chips and said substrate panels by dispensing under fill material through the space between every two adjacent semiconductor chips; and separating said substrate panel into a plurality of substrates each having a semiconductor chip-scale package formed there on.

2. The packaging process for manufacturing semiconductor chip-scale packages according to claim 1, wherein the step of separating said substrate panel is accomplished by cutting the substrate panel between every two adjacent semiconductor chips using a cutting apparatus.

3. The packaging process for manufacturing semiconductor chip-scale packages according to claim 1, wherein the step of separating said substrate panel is accomplished by punching each semiconductor chip-scale package.

4. The packaging process for manufacturing semiconductor chip-scale packages according to claim 1, wherein the step of bonding a heat slug to each semiconductor chip further includes forming at least an opening on the top plate of the heat slug before bonding.

5. The packaging process for manufacturing semiconductor chip-scale packages according to claim 4, wherein the step of separating said substrate panel is accomplished by cutting the substrate panel between every two adjacent semiconductor chips using a cutting apparatus.

6. The packaging process for manufacturing semiconductor chip-scale packages according to claim 4, wherein the step of separating said substrate panel is accomplished by punching each semiconductor chip-scale package.

7. A packaging process for manufacturing semiconductor chip-scale packages, comprising the steps of:

preparing a substrate panel having top and bottom surfaces;

attaching a plurality of semiconductor chips to the top surface of said substrate panel using flip chip technology, each of said semiconductor chips having an exposed outer surface;

applying an adhesive material on the outer surfaces of said semiconductor chips;

preparing a long heat slug having a top plate and a plurality of flanges, said long heat slug being approximately as long as said substrate panel and having a plurality of slot openings formed thereon with a regular distance approximately the distance between two semiconductor chips;

bonding said long heat slug to said semiconductor chips, said top plate covering said semiconductor chips, said flanges extending down by the sides of said semiconductor chips, and each of said slot opening being positioned between two adjacent semiconductor chips;

forming an under fill layer between said semiconductor chips and said substrate panels by dispensing under fill material through the slot opening between every two adjacent semiconductor chips; and separating said substrate panel into a plurality of substrates each having a semiconductor chip-scale package formed thereon.

8. The packaging process for manufacturing semiconductor chip-scale packages according to claim 7, wherein the step of separating said substrate panel is accomplished by cutting the substrate panel between every two adjacent semiconductor chips using a cutting apparatus.

9. The packaging process for manufacturing semiconductor chip-scale packages according to claim 7, wherein the step of preparing a long heat slug further includes forming at least one additional opening between every two slot openings on the top plate of said long heat slug, and said additional opening being positioned to expose a portion of a semiconductor chip in the step of bonding said long heat slug.

10. The packaging process for manufacturing semiconductor chip-scale packages according to claim 9, wherein the step of separating said substrate panel is accomplished by cutting the substrate panel between every two adjacent semiconductor chips using a cutting apparatus.

* * * * *